United States Patent [19]

Ohsawa

[11] Patent Number: 5,748,641
[45] Date of Patent: May 5, 1998

[54] TEST CIRCUIT OF SEMICONDUCTOR MEMORY DEVICE HAVING DATA SCRAMBLE FUNCTION

[75] Inventor: Takahashi Ohsawa, Yokohama, Japan

[73] Assignee: Kabushiki Kaisha Toshiba, Kawasaki, Japan

[21] Appl. No.: 813,672

[22] Filed: Mar. 7, 1997

Related U.S. Application Data

[63] Continuation of Ser. No. 391,536, Feb. 21, 1995, abandoned.

[30] Foreign Application Priority Data

Feb. 24, 1994 [JP] Japan .................................. 6-026647

[51] Int. Cl.[6] .................................................. G01R 31/28
[52] U.S. Cl. .......................... 371/21.3; 371/22.5; 365/201
[58] Field of Search .................................. 371/21.3, 21.1, 371/21.2, 22.5; 395/183.06; 364/550; 324/765; 365/190, 201, 230.03, 189.02, 189.04

[56] References Cited

U.S. PATENT DOCUMENTS 4,782,488  11/1988  Anderson ................................... 371/27

OTHER PUBLICATIONS

Patent Abstracts of Japan, vol. 14, No. 111 (P–1014), 28 Feb. 1990 (JP 1308979).
Patent Abstracts of Japan, vol. 13, No. 245 (P–881), 8 Jun. 1989 (JP 1047972).
Patent Abstracts of Japan, vol. 7, No. 148 (E–184), 29 Jun. 1983 (JP 58059649).

*Primary Examiner*—Phung Chung
*Assistant Examiner*—Nadeem Iqbal
*Attorney, Agent, or Firm*—Banner & Witcoff, Ltd.

[57] ABSTRACT

A test circuit according to the present invention is so constructed that a memory has a data scramble function and a write pattern can freely be set and changed in a test mode. Each of data lines is a pair of complementary lines. A data scrambler and a data descrambler are arranged on the input and output sides, respectively. A latch circuit receives some of row addresses and supplies eight pairs of scramble signals CHNG to the data scrambler. An ENTRY/EXIT circuit outputs a TEST signal for selecting the normal and test modes. The latch circuit controls the modes in response to the TEST signal. In the test mode, the data, the data scrambler scrambles write data of the data lines in response to a scramble signal, and the data descrambler descrambles read data read out to the data lines from each memory cell in which the write data is stored, in response to the scramble signal, to return the data to the state prior to the scramble.

33 Claims, 15 Drawing Sheets

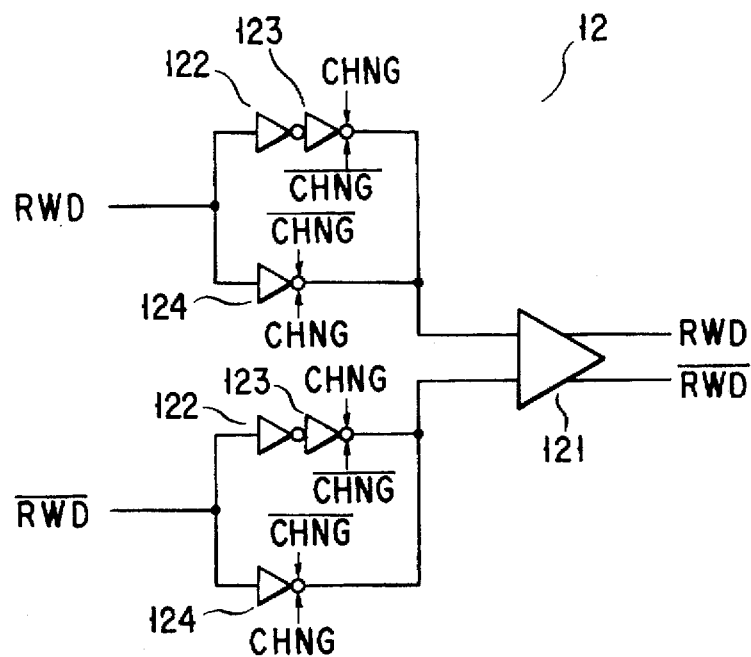
F I G. 7
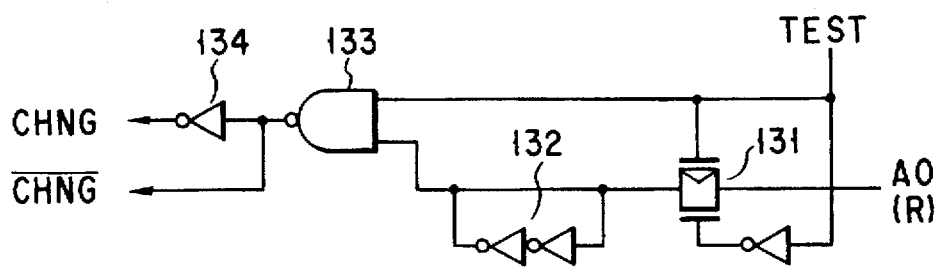
F I G. 8

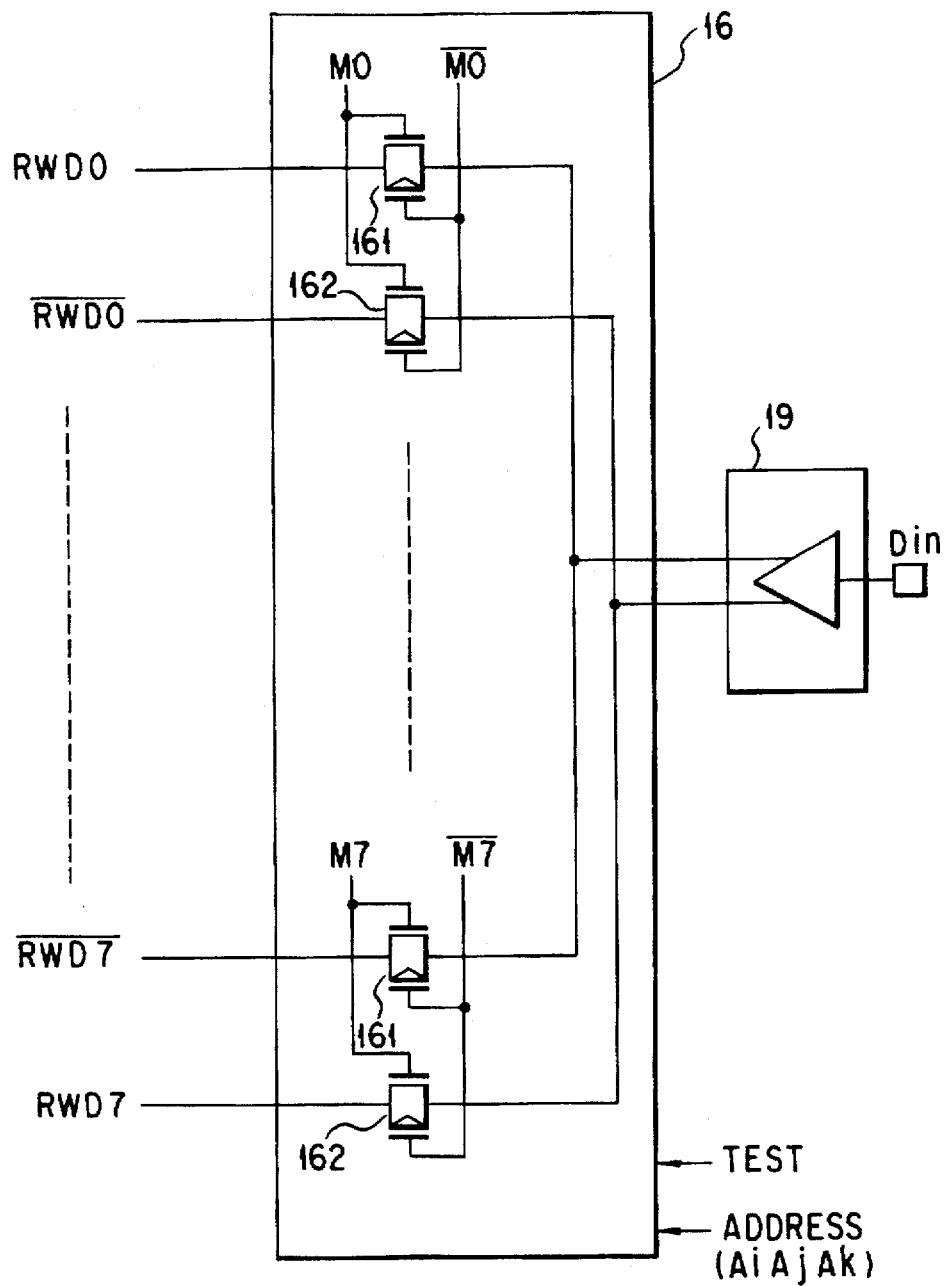
F I G. 9

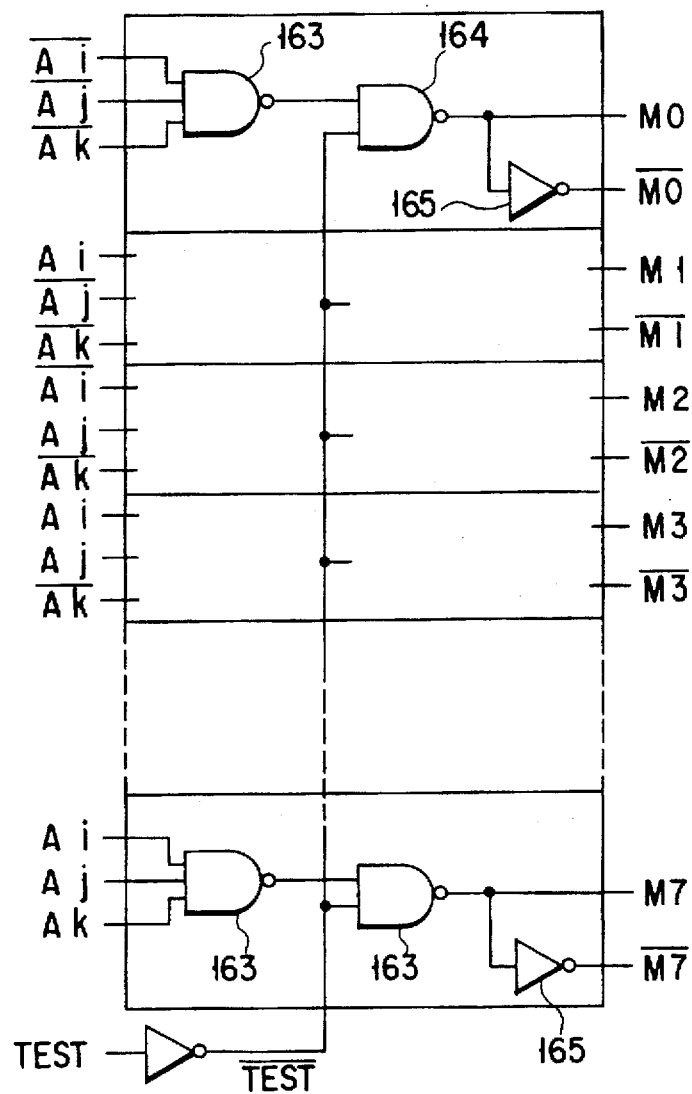
F I G. 10

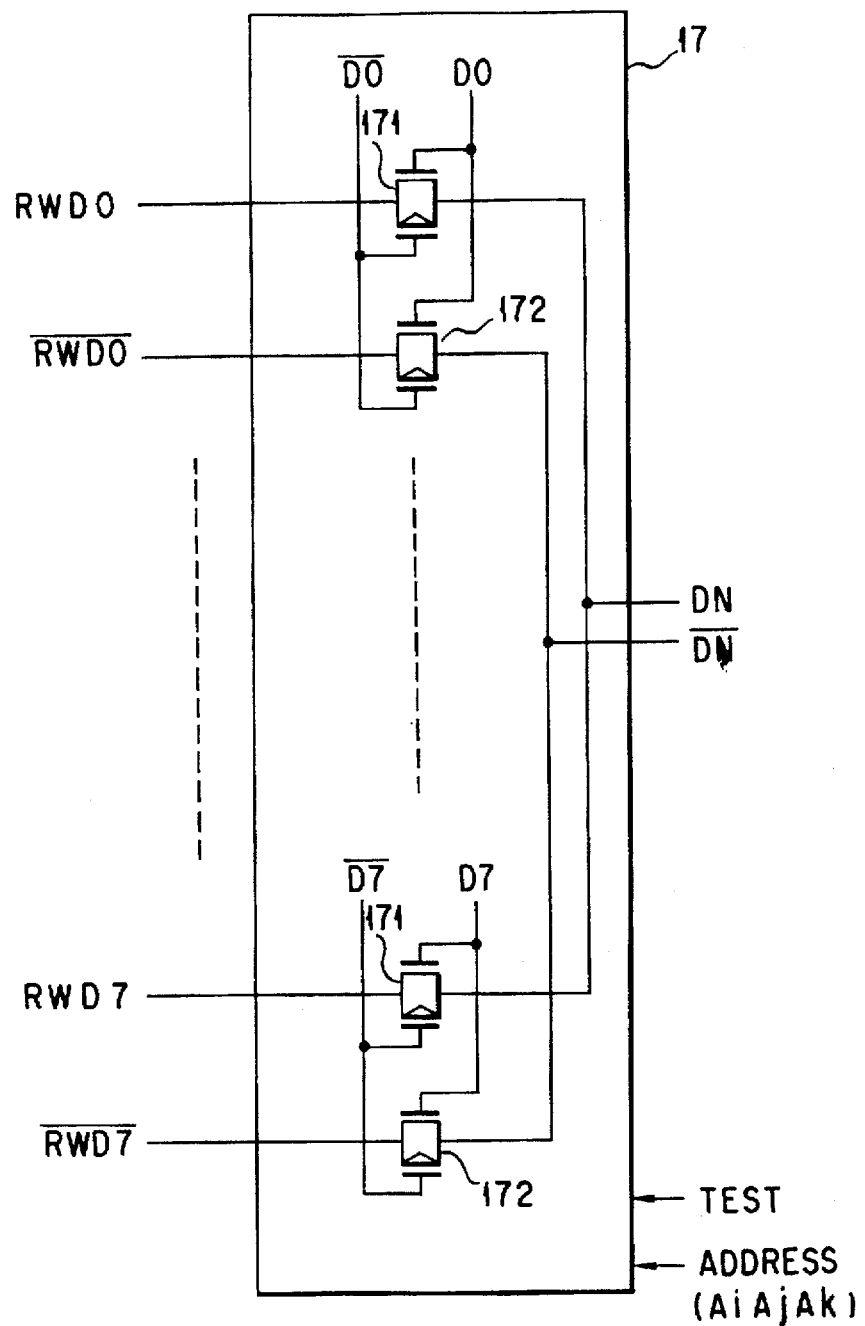
F I G. 12

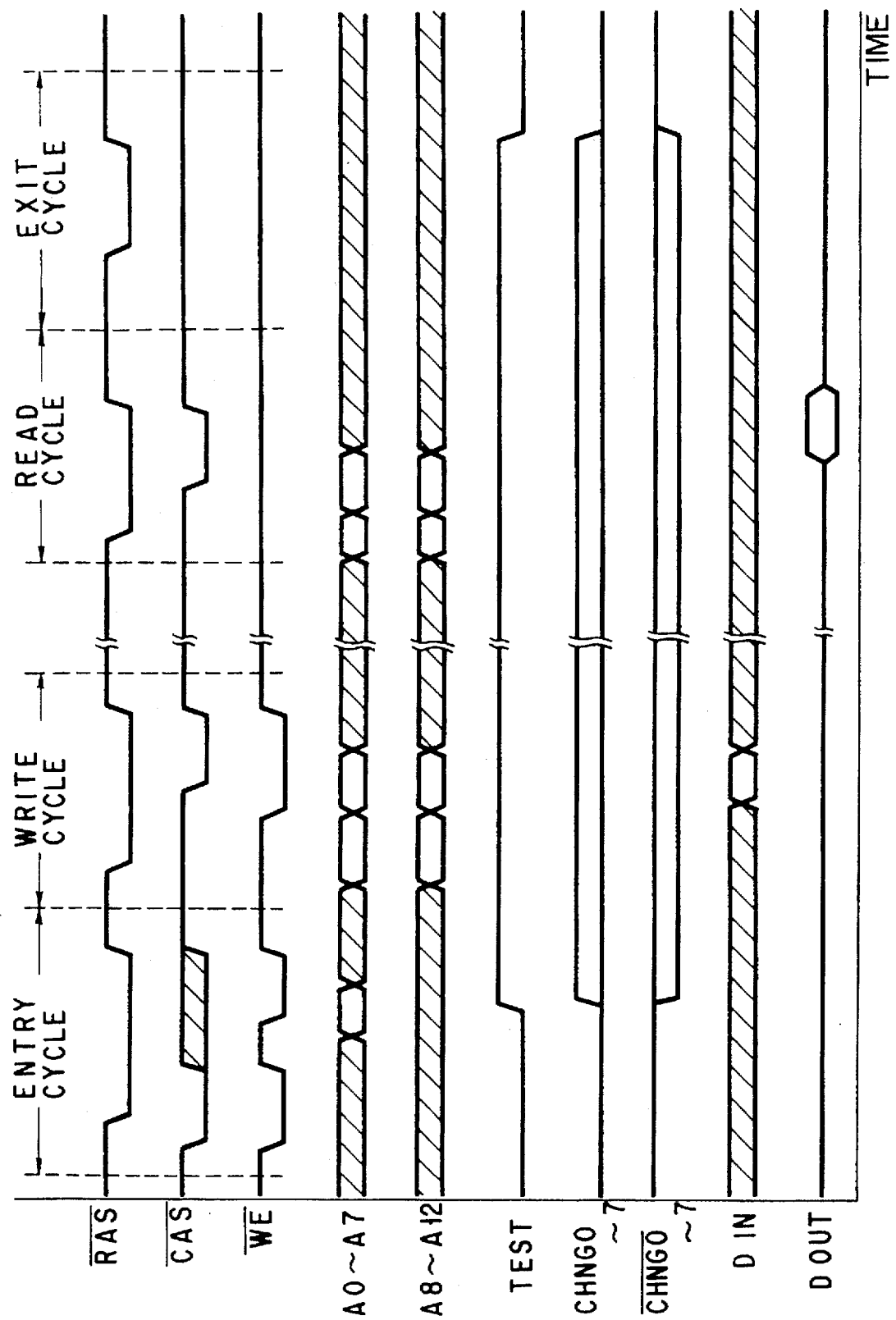
F I G. 14

TEST CIRCUIT OF SEMICONDUCTOR MEMORY DEVICE HAVING DATA SCRAMBLE FUNCTION

This application is a CONTINUATION of application Ser. No. 08/391,536, filed Feb. 21, 1995 now abandoned.

BACKGROUND OF THE INVENTION

1. Field of the Invention

The present invention relates to a semiconductor memory device having a large memory capacity and, more specifically, to a semiconductor memory device having a high-speed, high-precision test mode.

2. Description of the Related Art

A parallel-bit test mode is set in a DRAM posterior to the generation of a 1-Mbit DRAM in order to shorten the test time increasing in accordance with an improvement in packed density of semiconductor memories. The number of bits capable of being tested simultaneously is increased two times whenever the generation of memory capacity of DRAM goes by, for example, 4-bit parallel for 1-Mbit DRAM, 8-bit parallel for 4-Mbit DRAM, 16-bit parallel for 16-Mbit DRAM, and 32-bit parallel for 64-Mbit DRAM, thus preventing the time for testing all the bits from increasing. In other words, the time for testing all the bits in a normal access mode increases four times for each generation, whereas the increase in time can be reduced to two times by using a test mode.

The prior art test mode described above has the following function. Entry to the test mode is made in a cycle of WCBR ($\overline{WE}$ and $\overline{CAS}$ signals are activated before $\overline{RAS}$ signal is). After that, data input by a normal write operation is written as the same data to each of a plurality of bits. The plurality of bits of data are read out in parallel. If all the read-out data coincide with one another, a high-level signal is output. If the data include a different one, a low-level signal is output. Consequently, the plurality of bits can be tested at once in the test mode.

Though the foregoing test mode has the great merit of shortening the test time, it cannot necessarily cover all test items, because there are some defective items which cannot be detected in the prior art test mode. The defective items are caused by the plurality of bits which are not necessarily independent of one another but have a common word line. It is needless to say that the bits to be tested can be considered to be almost is completely independent by separating them sufficiently from one another on a cell array. If, however, the bits are so separated, a method of activating word lines WL and column selection lines CSL in the test mode differs from a normally-used one, thus increasing in waste of a control system. Since, furthermore, an internal operation different from a normal one is performed, the bits are not tested correctly.

FIG. 1 is a view for explaining a parallel test. For example, a 32-bit parallel test for a 64-Mbit DRAM shown in FIG. 1, will now be described. In a test mode, as shown in FIG. 17, 32 bits to be tested simultaneously are divided into four 16-Mbit cell array blocks CB1 to CB4 each having 8 bits. Each hatched block is a 512-Kbit cell block. The 8 bits belonging to one 16-Mbit block of the 16-Mbit cell array blocks are distributed to adjacent eight columns formed on the same word lines, as indicated by broken lines as memory cells CELL0 to CELL7 in FIG. 2.

In FIG. 2, WL, word lines; BL and $\overline{BL}$, complementary bit lines; SAPC, sense amplifiers and bit-line precharge circuits; DQG, DQ gates; DQ0 to DQ7 and $\overline{DQ0}$ to $\overline{DQ7}$, complementary data lines; and CSL, a column selection line (indicated by hatching). The word lines WL are connected to a low decoder. The eight pairs of the complementary data lines are connected to an I/O circuit shown in FIG. 1 via a DQ buffer (not shown).

As mentioned above, the 8 bits can be distributed to the eight columns remote therefrom, which is however unfavorable since the wiring of the column selection lines CSL is miniaturized, the pattern of a column decoder (not shown) is miniaturized, and the area thereof is increased in order to make one-to-one correspondence between the column selection lines CSL and the DQ gates.

In the distribution of 8 bits to be tested simultaneously, as shown in FIG. 2, they are not necessarily independent of one another. Since the same data is written in the test mode, if the relationship between BL and $\overline{BL}$ and the relationship between DQ and $\overline{DQ}$ are the same at the DQ gates, it is only the same data that can be written to the 8 bits. The prior art test mode therefore has a drawback in which a read system is incapable of detecting a defect having a pattern sensitivity to data. For example, a defect in data, which can be detected only when inverted data is written every one column, cannot be detected in the prior art test mode.

The prior art test mode is also considered to be imperfect under the other condition. For example, a defect that the word lines WL do not start to operate as a kind of defect in row address. When the relationships between BL and $\overline{BL0}$ and between DQ and $\overline{DQ}$ are always the same, the same data is written to all the 8 bits shown in FIG. 2 in the test mode. There occurs an avoidable imbalance in pattern at the DQ and $\overline{DQ}$ gates or DQ buffer, and there is strong possibility that all the data lines DQ latch data to a low or high level when a cell signal is set at zero. Therefore, the prior art test mode has a drawback in which a defect in data cannot be detected since the detection is based on whether all bits coincide with one another.

In spite of the above drawbacks of the prior art test mode, if the bits are tested by the front and back patterns, four 16-Mbit blocks are finally grouped into one bit, and thus the bit can always be detected by either of the patterns. However, when the bits are tested independently for every 16 Mbit block (or when a row address having a defect is detected) for the purpose of replacement of redundancy as in the test mode for die sort, the defect cannot be detected even by testing the bits by the front and back patterns.

As described above, the prior art test mode is capable of reducing in test time is not necessarily omnipotent for all data items to be tested, and has a drawback of being incapable of detecting a defect in some of the data items.

SUMMARY OF THE INVENTION

It is accordingly an object of the present invention to provide a semiconductor memory device which allows data to be written in a free pattern and improves the capability of detecting a defect in data in a test mode and thus heightens the rate of use of the test mode thereby to shorten the test time.

The above object is attained by the constitution of a semiconductor memory device having a data scramble circuit, comprising:

a plurality of data transmission lines connected to memory cells;

signal latch means for latching a signal for setting a scramble condition of data transmitted through each of the plurality of data transmission lines;

data scrambling means for scrambling the data in accordance with the scramble condition; and control means for determining a test mode, and transmitting the scramble condition from the signal latch means to the data scrambling means to operate the data scrambling means.

According to the semiconductor memory device having the above constitution, the data scrambling means allows a test pattern to be freely written, as data mixing "0" and "1", to a plurality of cells from which data is read out in parallel in a test mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram showing a specific example of a data descrambler of the embodiment of FIG. 3;

FIG. 8 is a circuit diagram showing a specific example of a latch circuit of the embodiment of FIG. 3;

FIG. 9 is a circuit diagram showing an arrangement of a demultiplexer and its peripheral device of FIG. 4;

FIG. 10 is a circuit diagram showing a constitution for controlling the demultiplexer of FIG. 9;

FIG. 12 is a circuit diagram showing a specific example of the multiplexer of FIG. 11;

FIG. 14 is a timing chart of operations of the circuit shown in FIG. 4;

DETAILED DESCRIPTION OF THE PREFERRED EMBODIMENTS

Figure 3:
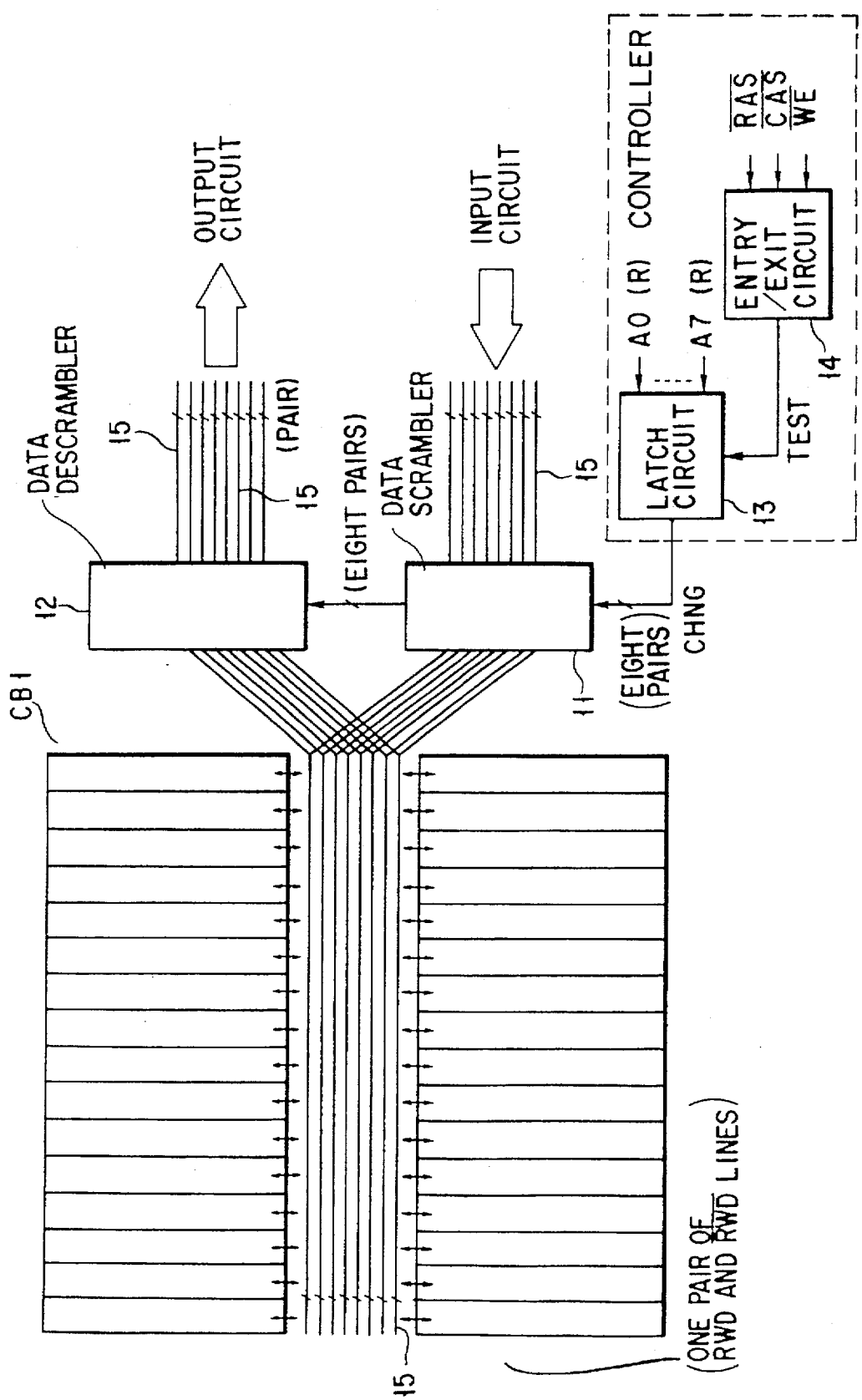
FIG. 3 is a circuit diagram of the main part of an embodiment of the present invention.

FIG. 3 shows one (CB1) of 16-Mbit cell arrays according to an embodiment of the present invention. FIG. 3 also shows circuits operated in a test mode and not a circuit operated in a normal access mode (e.g., a demultiplexer in a read mode). As illustrated in FIG. 3, a data scrambler 11 for receiving signals and a data descrambler 12 for transmitting signals are arranged, and a latch circuit 13 for receiving some of row address signals and supplying eight pairs of scramble signals CHNG and $\overline{\text{CHNG}}$ to the scrambler 11 and an ENTRY/EXIT circuit 14 for outputting a TEST signal for selecting one of normal and test modes, are formed. In the latch circuit 13, the modes are controlled in response to the TEST signal output from the circuit 14. Data lines 15 are constituted of pairs of complementary lines RWD and $\overline{\text{RWD}}$.

According to the circuit arrangement described above, when test data to be tested in parallel is written, its pattern can be converted to a desired one by the data scrambler 11 and, when the test data is read out, its pattern can be converted by the data descrambler 12 in the same scramble situation to return the test condition to the original one determined before the test data is supplied to the data scrambler 11.

Figure 4:
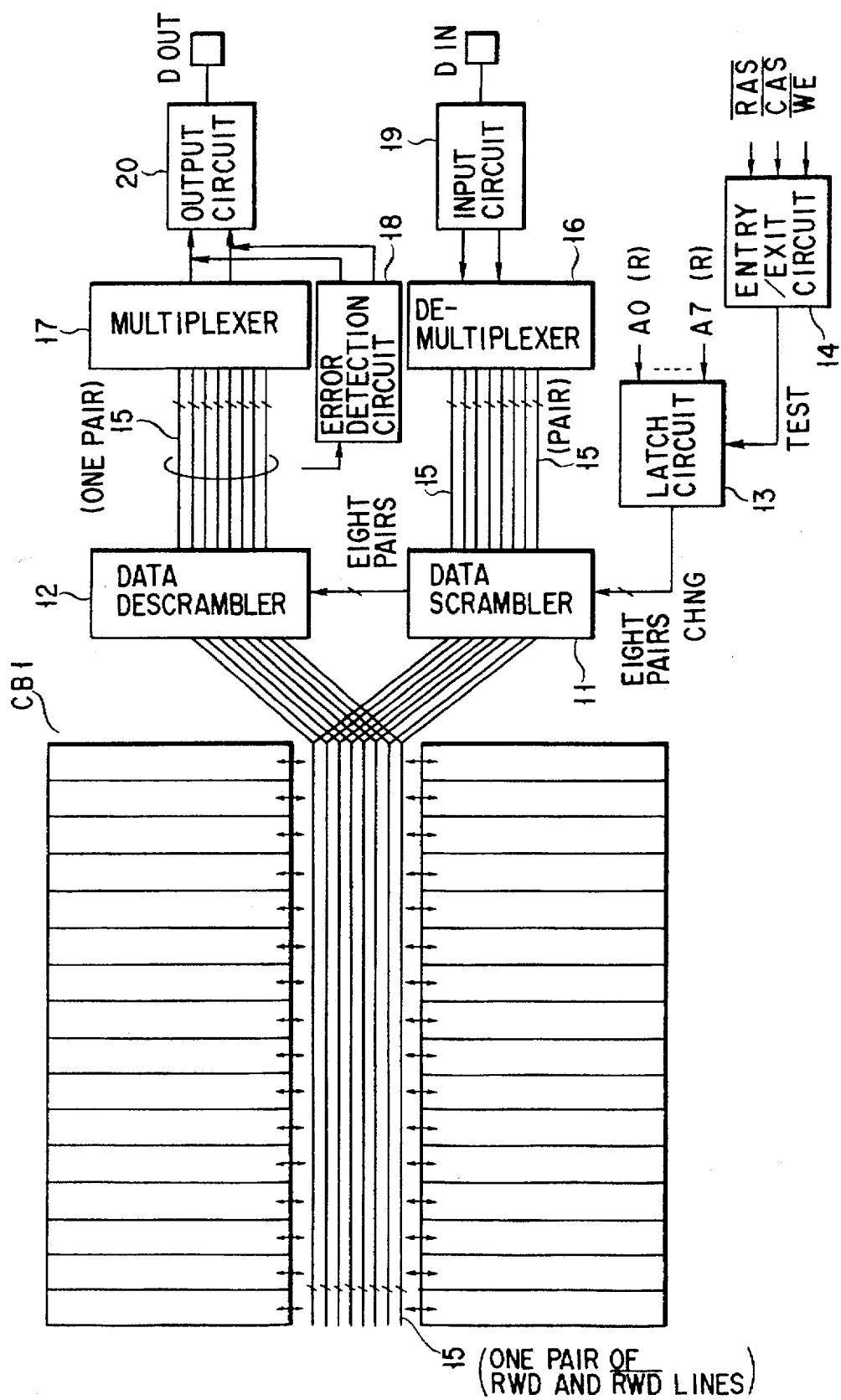
FIG. 4 is a circuit diagram showing a constitution of the embodiment of FIG. 3 more specifically.

FIG. 4 is a circuit diagram showing the arrangement of the circuits of FIG. 3 more specifically. The arrangement shown in FIG. 3 includes a demultiplexer 16 and a multiplexer 17 operated in a normal access mode, an error detection circuit 18, and the like. The error detection circuit 18 detects coincidence and noncoincidence of data from the results of the test. In the test mode, test data Din is supplied from an input pad through an input circuit 19. A result of the test is transmitted through the error detection circuit 18 and an output circuit 20 and then obtained as a signal Dout from an output pad. The DRAM used in the embodiment is assumed to be a x 1-bit product.

The operations of the circuits shown in FIG. 4 will now be described.

Figure 5:
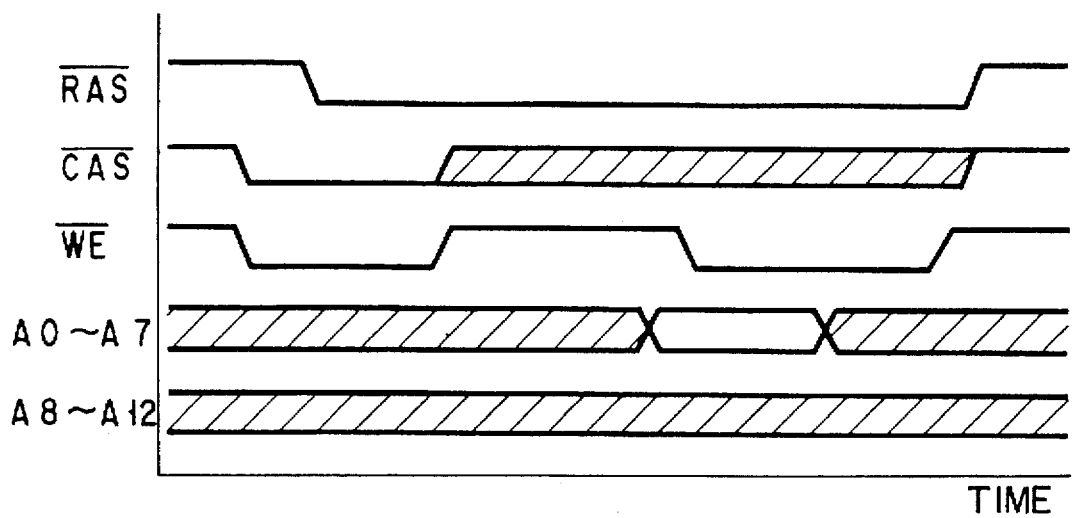
FIG. 5 is a view showing an example of waveforms indicating a cycle of entry to a test mode.

FIG. 5 show waveforms indicating a cycle of entry to the test mode. After a WCBR cycle starts, a $\overline{\text{WE}}$ signal cycles two times with a $\overline{\text{RAS}}$ signal at a low level, and 8-bit addresses A0 to A7 are specified at the second fall of the $\overline{\text{WE}}$ signal.

The above addressing is as follows. The addresses A0 to A7 are assigned to the eight bits of memory cells CELL0 to CELL7 tested simultaneously as indicated by hatching in FIG. 2. The following convention is determined. The test data to be input in the test mode is transmitted as it is when the address signal is "0", while the test data is reversed when the signal is "1".

Assuming that all addresses A0 to A7 are "0" in the second cycle of $\overline{\text{WE}}$ signal, data is written or read as it is (without being scrambled). This test mode is thus the same as the prior art test mode. If A0="0", A1="1", A2="0", A3="1", A4="0", A5="1", A6="0" and A7="1", the inverted data is written every one bit.

Figure 6:
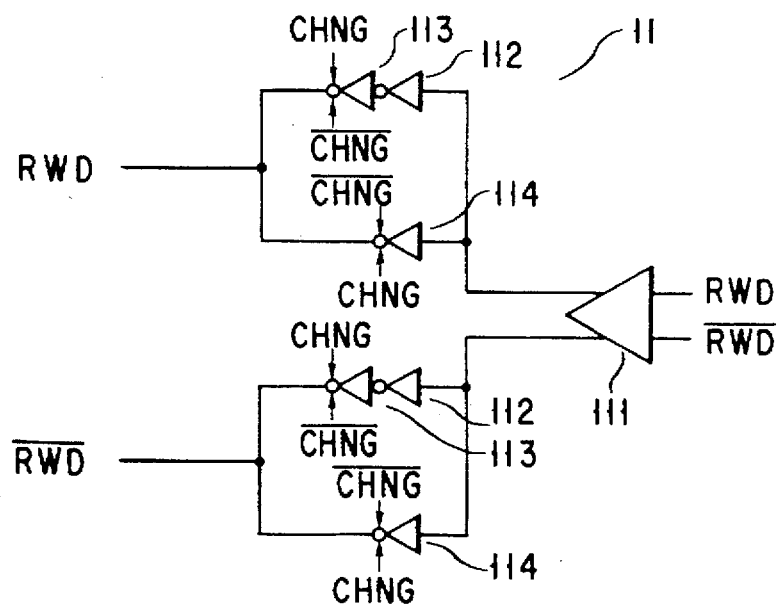
FIG. 6 is a circuit diagram showing a specific example of a data scrambler of the embodiment of FIG. 3.

FIG. 6 is a circuit diagram of a specific example of the data scrambler 11 of FIG. 3 or 4 which is constituted based on the assumption of the above convention in the test mode. Since, in the embodiment shown in FIG. 3, there are eight pairs of data lines 15 (RWD and $\overline{\text{RWD}}$ lines), each of the eight pairs requires the data scrambler shown in FIG. 6. The RWD and $\overline{\text{RWD}}$ lines are so formed that data is inverted or not through a series-connected inverter 112 and clocked inverter 113 or through a clocked inverter 114. The inverter 112 and clocked inverter 113 are controlled by the scramble signals CHNG or their inverted signals $\overline{\text{CHNG}}$, and activated complementarily to each other.

If CHNG=H (high level) and $\overline{\text{CHNG}}$=L (low level), the data from the input buffer 111 is inverted by the inverter 114, whereas if CHNG=L and $\overline{\text{CHNG}}$=H, the data is not inverted because it passes through the two inverters 112 and 113. Needless to say, these inverters can be replaced with transfer gates of CMOS, and various modifications can be applied to the data scrambler 11 of FIG. 6.

FIG. 7 is a circuit diagram of a specific example of the data descrambler 12 corresponding to the data scrambler shown in FIG. 6. The circuit arrangement of the data descrambler of FIG. 7 is the same as that of the data scrambler, except for the input and output directions opposite to those of the circuit shown in FIG. 6. It is also needless to say that the data descrambler of FIG. 7 is provided for each of the eight pairs of data lines 15, and various modifications can be applied to the descrambler.

FIG. 8 is a circuit diagram of a specific example of the latch circuit 13 shown in FIG. 3. The latch circuit is provided for an address A0(R) (R: row address) and required for each of 8-bit addresses A0 to A7. The address A0 is connected to one input of a NAND gate 133 via a CMOS transfer gate 131, controlled in response to a TEST signal, and a latch circuit 132. The other input of the NAND gate 133 is supplied with the TEST signal. The NAND gate 133 outputs a signal $\overline{\text{CHNG}}$, and the signal is changed to CHNG by means of an inverter 134.

According to the circuit arrangement shown in FIG. 8, if the TEST signal is at a low level, data is not inverted when CHNG=L and $\overline{\text{CHNG}}$=H. In the normal mode, the TEST signal is fixed to the low level. If, in the cycle of ENTRY as shown in FIG. 5, a row address buffer is operated, row addresses Ax(R), $\overline{\text{Ax(R)}}$ (x=0 to 7) are designated, and the TEST signal rises up to the high level, the row address Ax(R) is latched. This latched signal produces signals CHNG and $\overline{\text{CHNG}}$. Needless to say, various modifications can be made to the circuit arrangement shown in FIG. 8.

FIG. 9 is a circuit diagram showing an arrangement of the demultiplexer 16 and its peripheral device of FIG. 4. In FIG. 9, the same elements as those of FIG. 4 are indicated by the same reference numerals. The demultiplexer includes eight pairs of CMOS transfer gates 161 and 162 for controlling the transfer of complementary data of signal Din supplied to the input circuit 19 in response to signals M0 to M7 and $\overline{\text{M0}}$ to $\overline{\text{M7}}$. These transfer gates 161 and 162 are connected to eight pairs of data lines (RWD0, $\overline{\text{RWD0}}$) to (RWD7, $\overline{\text{RWD7}}$).

FIG. 10 shows a circuit for generating the signals M0 to M7 and $\overline{\text{M0}}$ to $\overline{\text{M7}}$ from input addresses. Assume that all bit strings of 3 bits are utilized. If an address (Ai Aj Ak) is (1 1 1), there occurs an increment from ($\overline{\text{Ai}}$ $\overline{\text{Aj}}$ $\overline{\text{Ak}}$) to (Ai Aj Ak), or from (0 0 0) to (1 1 1). Eight NAND gates 163 are provided for inputting their corresponding bit strings. Each output of the NAND gates 163 is connected to one input of each of eight NAND gates 164 corresponding thereto. The other inputs of the NAND gates 164 are supplied with an inverted signal $\overline{\text{TEST}}$ of TEST signal. The AND gates 164 output signals M0 to M7 or signals $\overline{\text{M0}}$ to $\overline{\text{M7}}$ through inverters 165.

Figure 11:
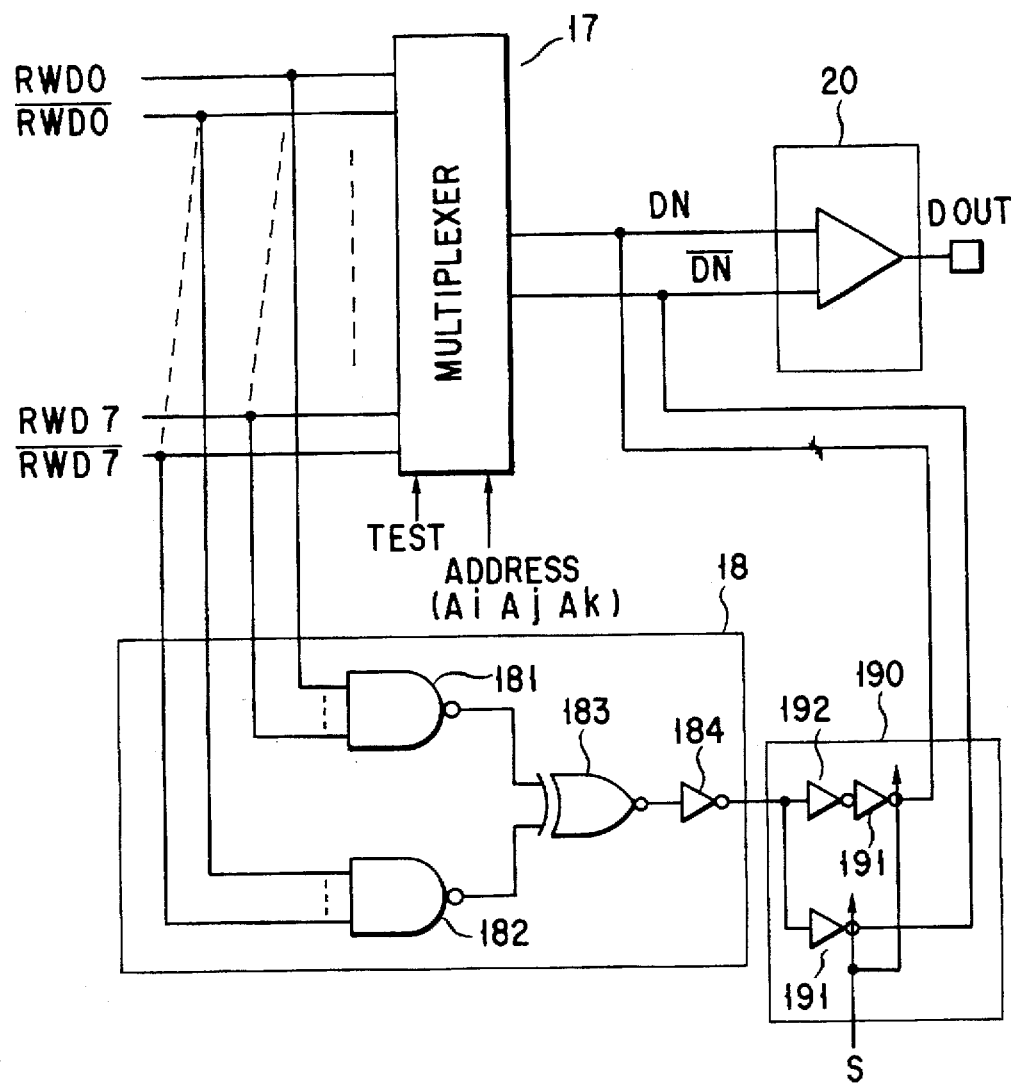
FIG. 11 is a circuit diagram showing an arrangement of a multiplexer, an error detection circuit, and their peripheral devices of FIG. 4.

FIG. 11 is a circuit diagram showing an arrangement of multiplexer 17, error detection circuit 18, and their peripheral devices of FIG. 4. In FIG. 11, the same elements as those of FIG. 4 are denoted by the same reference numerals. The error detection circuit 18 for detecting the coincidence/noncoincidence of test data, includes a NAND gate 181 connected to data lines RWD0 to RWD7 of eight pairs of data lines RWDx and $\overline{\text{RWDx}}$ (x=0 to 7) through which signals are supplied to the multiplexer 17, a NAND gate 182 connected to signal lines $\overline{\text{RWD0}}$ to $\overline{\text{RWD7}}$ thereof, an EXOR gate 183 supplied with signals output from the gates 181 and 182, and an inverter 184 through which an output signal of the EXOR gate 183 is supplied to a switching circuit 190. The switching circuit 190 includes clocked inverters 191 for activating a test signal. (For example, when a signal S is generated, the clocked inverters activate it to a high level.) the circuit 190 also includes an inverter 192 for forming complementary data lines. The complementary data lines are connected to input terminals (nodes DN and $\overline{\text{DN}}$) of the output circuit 20.

FIG. 12 is a circuit diagram showing a specific example of the multiplexer 17 of FIG. 11. As shown in FIG. 12, the eight pairs of data lines RWDx and $\overline{\text{RWDx}}$ (x=0 to 7) are connected to their respective eight pairs of CMOS transfer gates 171 and 172 which are controlled by signals Dx and $\overline{\text{Dx}}$ (x=0 to 7). While the eight data lines RWDx are connected in common through the transfer gates 171, the eight data lines $\overline{\text{RWDx}}$ are connected in common through the transfer gates 172. The common connecting points of the data lines RWDx and $\overline{\text{RWDx}}$ are connected to their corresponding nodes DN and $\overline{\text{DN}}$ of the output circuit 20.

Figure 13:
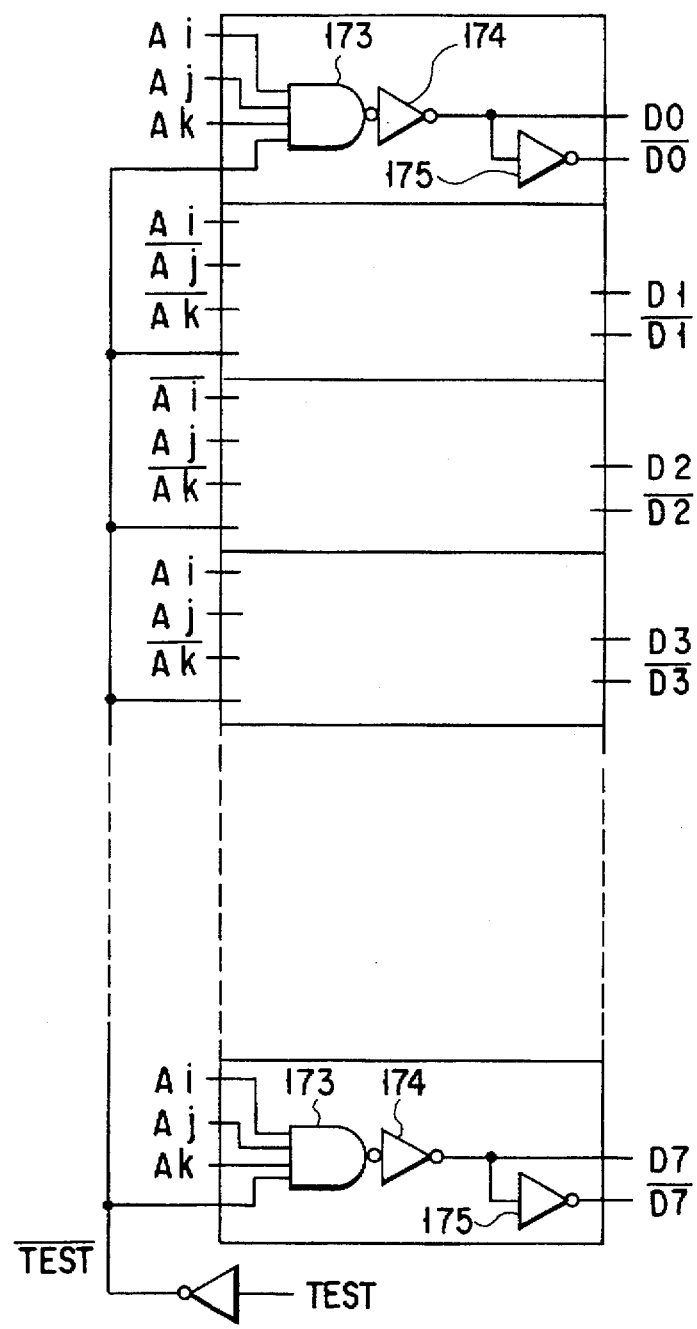
FIG. 13 is a circuit diagram showing a constitution for controlling the multiplexer of FIG. 12.

FIG. 13 shows a circuit for generating the above signals Dx and $\overline{\text{Dx}}$ from input addresses. In this circuit, an inverter 174 is connected to each output of NAND gates 173 corresponding to the NAND gates 163 shown in FIG. 10. The NAND gates 173 are all supplied with an inverted signal $\overline{\text{TEST}}$ of TEST signal. The inverters 174 produce signals D0 to D7 or signals $\overline{\text{D0}}$ to $\overline{\text{D7}}$ through inverters 175.

The operation of entry to the test mode in the circuit shown in FIG. 4, will now be described with reference to the timing chart of FIG. 14.

If the $\overline{\text{WE}}$ signal and $\overline{\text{CAS}}$ signal are activated prior to the $\overline{\text{RAS}}$ signal (WBCR cycle) and the $\overline{\text{WE}}$ signal is counted two times, the ENTRY/EXIT circuit 14 generates a TEST signal at the second activation of the $\overline{\text{WE}}$ signal. Simultaneously, a row address buffer is operated to take row addresses A0(R) to A12(R) into the chip. Of these row addresses, addresses A0 to A7 are input to the latch circuit 13 to be latched by a TEST signal, with the result that input data is scrambled. Unless a special EXIT cycle operation is performed, the test mode is not released, and the scrambled state remains in the DRAM.

A write operation of the test mode will now be described. A write operation for a normal DRAM can be carried out if the $\overline{\text{RAS}}$, $\overline{\text{CAS}}$, and $\overline{\text{WE}}$ signals are all returned to a precharge state after completion of the ENTRY cycle. For example, in the x 1-bit DRAM as described above, write data input from a pin of data input Din is transferred, as the same 8-bit data, to each of 16-Mbit cell arrays.

When the write data passes through the data scrambler 11 provided for each 16-Mbit array, it is scrambled based on the set scrambled state. More specifically, data corresponding to "0" of 8-bit scramble signals CHNGx (x=0 to 7) passes through the data scrambler 11, whereas data corresponding to "1" is inverted and the inverted data is transmitted to each bit. The 8-bit data, which is transmitted to the eight pairs of RWD lines through the data scrambler, is written to an addressed one of two 512-Kbit cell blocks, in other words, the 8-bit data is input to the eight columns shown in FIG. 2 and written to the eight bits of memory cells CELL0 to CELL7 whose word lines have been actuated.

Figure 1:
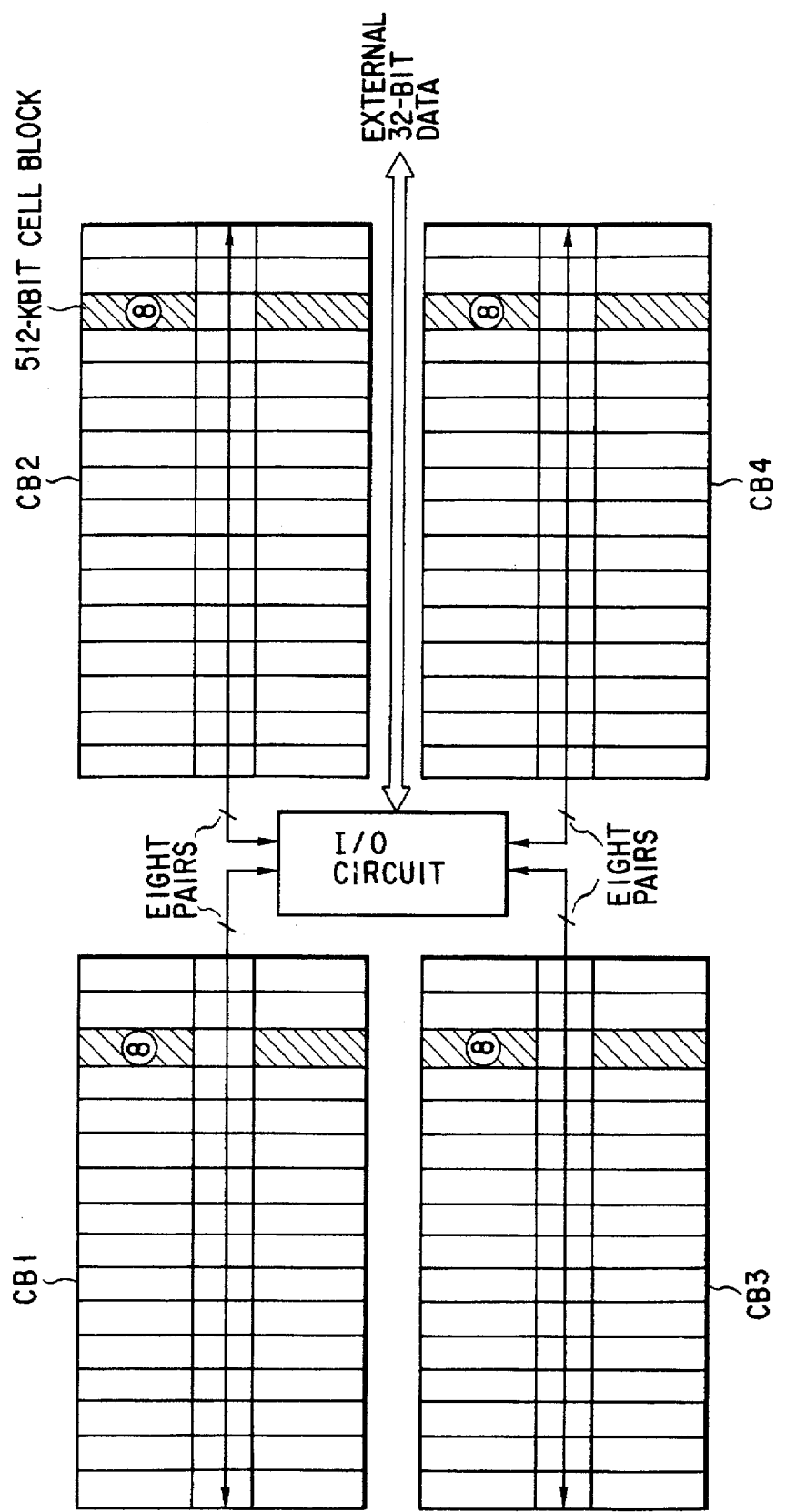
FIG. 1 is a view of a 64-Mbit DRAM chip, for explaining a 32-bit parallel test therein.
Figure 2:
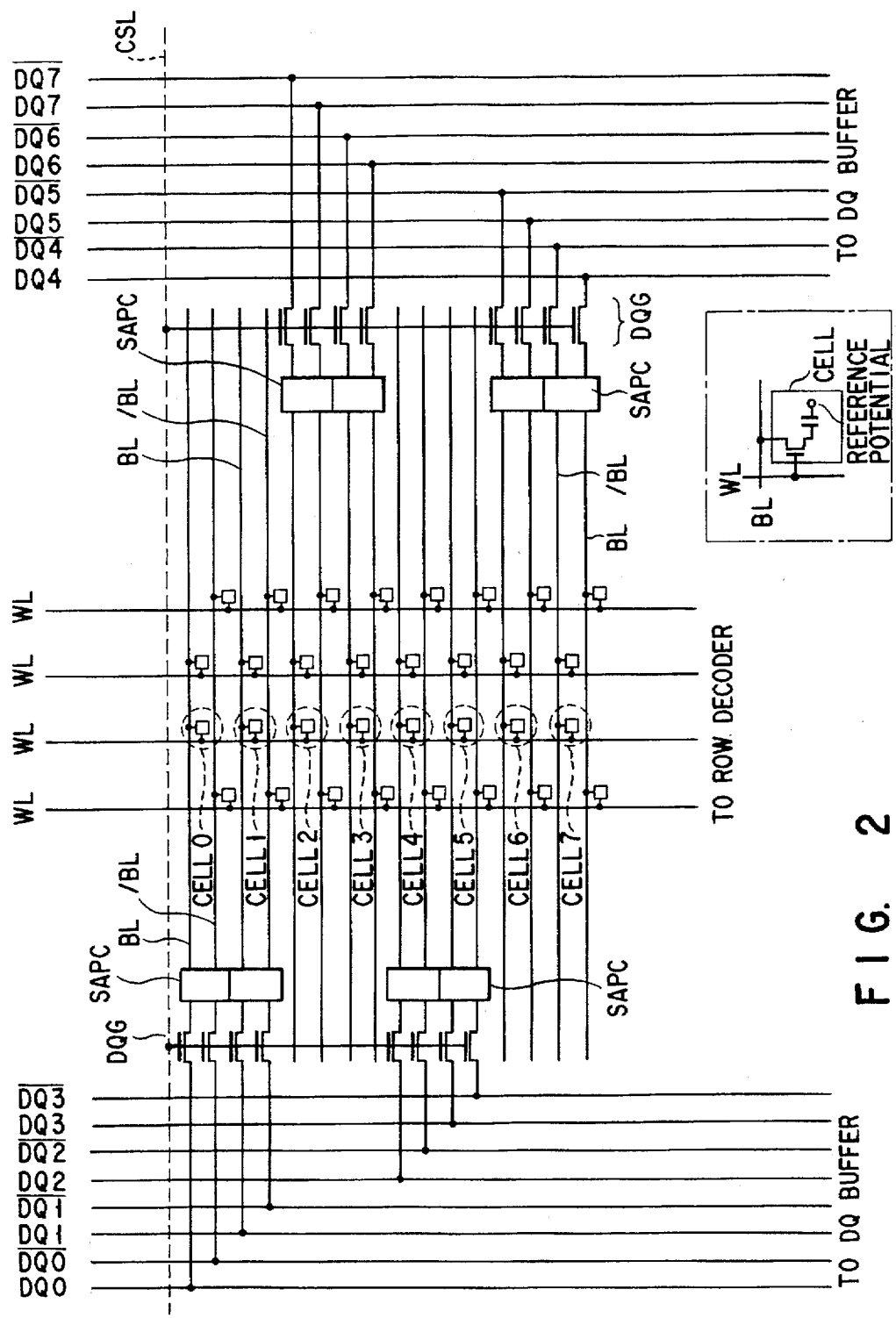
FIG. 2 is a circuit diagram showing part of the 64-Mbit DRAM chip of FIG. 1.

A read operation of the test mode will now be described. A normal read operation can be performed by writing data to all cell arrays or some of the cell arrays necessary for a test. As shown in FIG. 2, all data of the cells connected to the word lines WL selected by the row addresses are amplified by the sense amplifiers. Of these data, the 8-bit data selected by the column selection line CSL are read out from the pairs of data lines DQ and $\overline{DQ}$ and amplified again by their corresponding DQ buffers (not shown). The amplified data are read out from the eight pairs of RWD lines as shown in FIG. 4. The data of these RWD lines are transmitted to the output circuit 20 through the data descrambler 12.

Whether the 8-bit data coincide with one another or not is determined by the error detection circuit 18 before the data is transmitted to the output circuit 20. If they coincide, signal "1" is output from the output pin Dout. If not, signal "0" is output therefrom. The 8-bit data read out from the memory cells to the RWD line do not generally coincide with one another even when no errors occur since the data are transmitted through the data scrambler 11 in the write operation. However, the state set in the data descrambler 12 is the same as the scramble state set in the data scrambler 11; therefore, the 8-bit data output from the data descrambler 12 are returned to the write state and coincide before being scrambled if the data have no errors when they are output from the data descrambler 12.

The coincidence/noncoincidence in the error detection circuit 18 can be determined by the same circuit arrangement as that of a conventional parallel bit test mode determination circuit. The present invention can be attained by the data scrambler 11 interposed between the input circuit and RWD line pairs and the data descrambler 12 interposed between the RWD line pairs and output circuit. To control these scrambler and descrambler, the latch circuit 13 and ENTRY/EXIT circuit 14 are needed.

Figure 15:
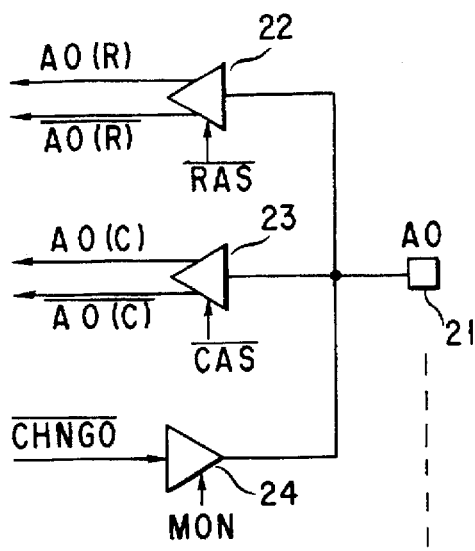
FIG. 15 is a circuit diagram showing a constitution of the main part of an example applied to the embodiment of the present invention, having a scramble information monitor function.
Figure 15:
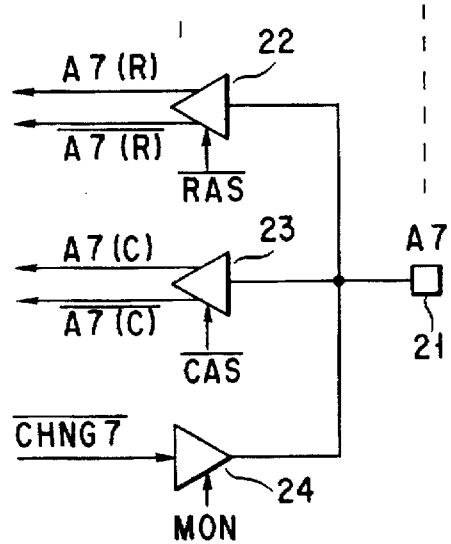

FIG. 15 is a circuit diagram showing a constitution of the main part of an example applied to the embodiment of the present invention. This example has a scramble information monitor function for externally monitoring information as to how data is scrambled. The circuit arrangement shown in FIG. 15 is the same as that of the conventional circuit in that the row address buffer 22 and column address buffer 23 are connected to each of pads 21 to which addresses A0 to A7 for setting conditions of the scrambler are input. In FIG. 15, a scramble monitor circuit 24 is connected to each of the pads 21 in addition to the buffers 22 and 23. The scramble monitor circuit 24 is controlled by a signal MON.

Figure 16:
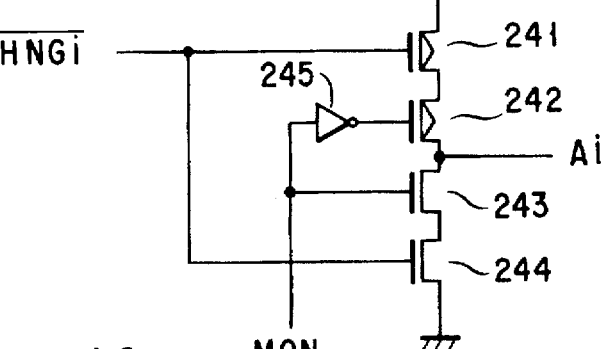
FIG. 16 is a circuit diagram of a specific example of a scramble monitor circuit.

FIG. 16 is a circuit diagram specifically showing the scramble monitor circuit 24. The circuit 24 includes a P-channel MOS transistor 241 arranged alongside a power supply and controlled by scramble signals $\overline{CHNGx}$ (x=0 to 7), an N-channel MOS transistor 244 arranged alongside a ground potential and controlled by the scramble signals, and P- and N-channel MOS transistors 242 and 243 connected in series between the MOS transistors 241 and 244. The gate of the transistor 243 is supplied with the signal MON, and the gate of the transistor 242 is supplied with an inverted signal $\overline{MON}$ of signal MON from an inverter 245. A connecting point of the transistors 242 and 243 is connected to the pad 21 of the corresponding address Ax (x=0 to 7).

Figure 17:
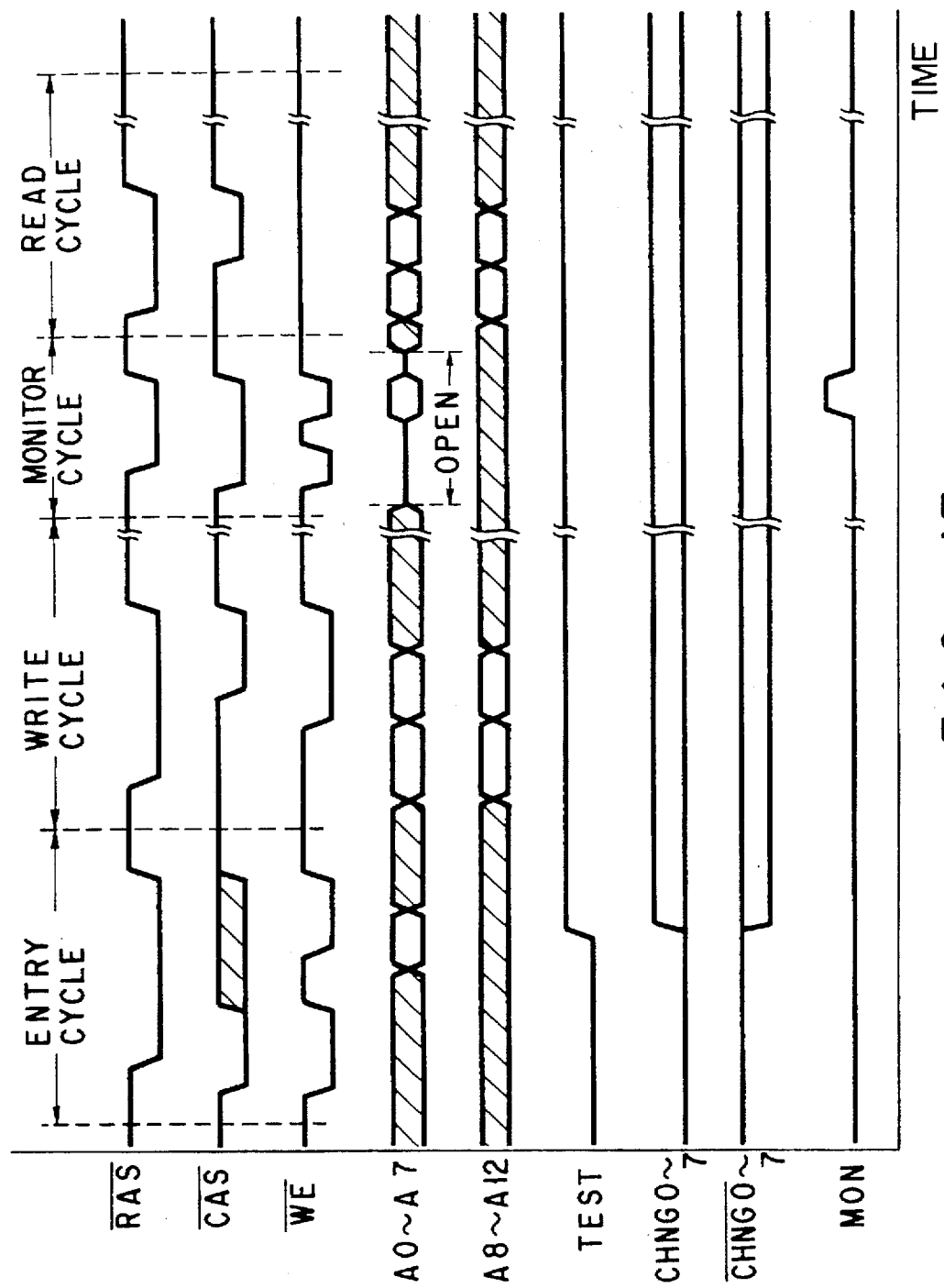
FIG. 17 is a timing chart including a monitor cycle of the present invention.

FIG. 17 is a timing chart including a monitor cycle. In the test mode (in which TEST signal is at a high level) after the ENTRY cycle before the EXIT cycle, the $\overline{WE}$ signal cycles two times. The monitor signal MON thus starts to rise, and the latched scramble state is output from, e.g., an address pin (not shown). The scramble state can thus be confirmed on the tester side. "OPEN" in FIG. 17 means a time period during which a driver (not shown) of the tester is opened.

Figure 18:
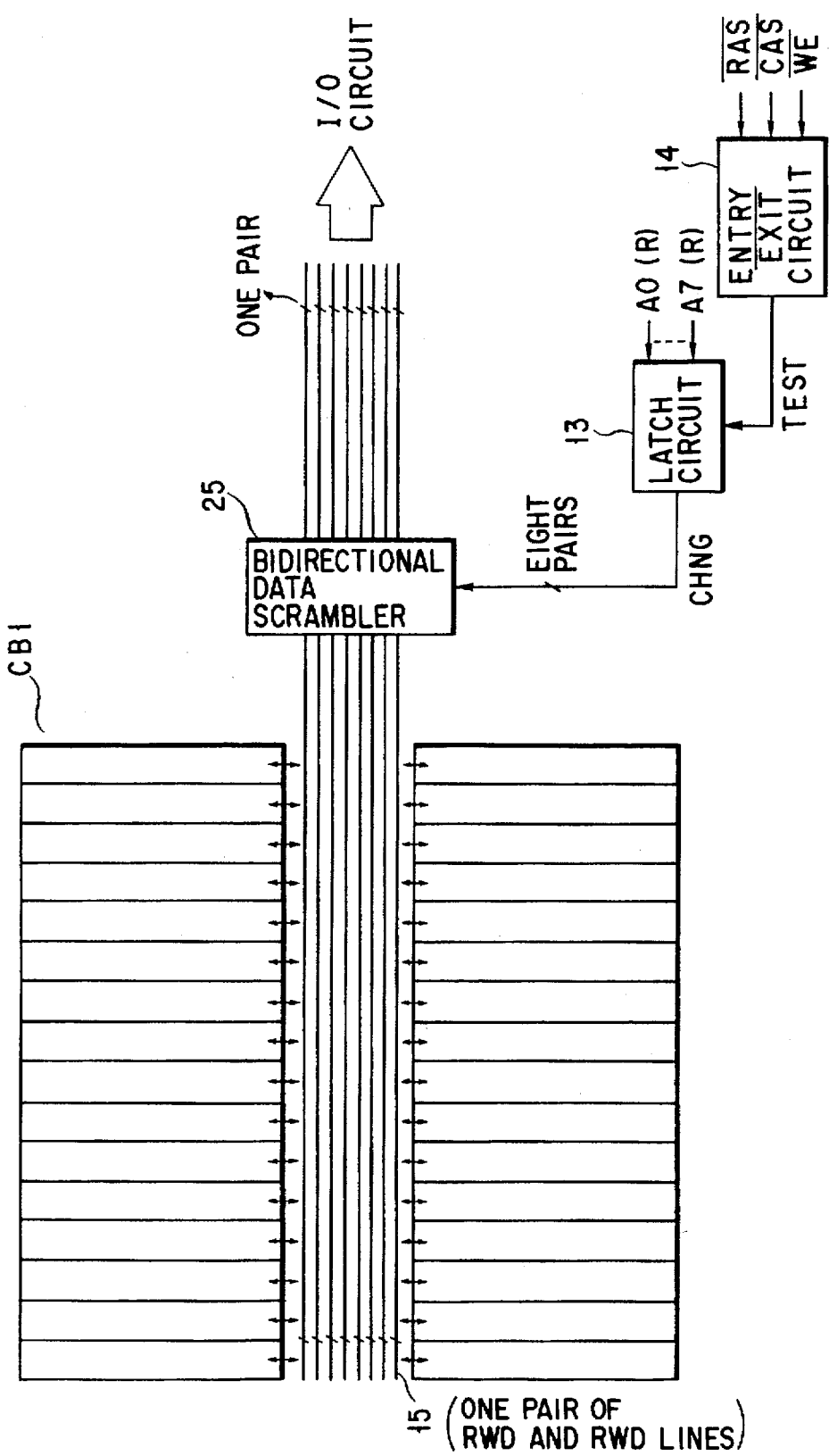
FIG. 18 is a circuit diagram showing another embodiment of the present invention.

FIG. 18 is a circuit diagram showing another embodiment of the present invention in which a bidirectional data scrambler 25 is used. In FIG. 18, the same elements as those of FIG. 3 are indicated by the same reference numerals. The operation of the circuit is basically the same as that of the circuit of FIG. 3 and thus its description is omitted.

According to the above embodiments, a write pattern can be freely set in the test mode by incorporating the data scrambler, and a parallel test for items, which were not be detected conventionally, can be carried out. Consequently, the degree of freedom of the parallel test is greatly improved, a large variety of items for the parallel test can be prepared, and the whole test time can be shortened.

In the above embodiments, as shown by the timing chart in FIG. 14, the TEST signal rises at the second fall of $\overline{WE}$ signal in the ENTRY cycle and falls at the rise of $\overline{RAS}$ signal in the EXIT cycle. The ENTRY/EXIT circuit 14 for selecting the test mode can be operated in the other cycles. The TEST signal can be caused to rise by supplying a signal to the pad without any specific cycle.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device having a data scramble circuit, comprising:

a plurality of data transmission lines connected to each of a plurality of memory cells;

signal latch means for latching a signal for setting a scramble condition of data transmitted through each of said plurality of data transmission lines;

data scrambling means for scrambling the data in accordance with the scramble condition; and control means for determining a test mode, and transmitting the scramble condition signal from said signal latch means to said data scrambling means to operate said data scrambling means, wherein the data transmitted to one of said plurality of memory cells is independent from data transmitted to another one of said plurality of memory cells.

2. The semiconductor memory device according to claim 1, wherein said signal latch means uses row address signals.

3. The semiconductor memory device according to claim 2, wherein said data scrambling means includes a data scrambler for scrambling the data in accordance with the scramble condition in the test mode and changing the scrambled data to write data to be written to each of said plurality of memory cells, and a data descrambler for descrambling read data, which is read out from said each of said plurality memory cells to said plurality of data transmission lines, in the test mode.

4. The semiconductor memory device according to any one of claims 1 to 3, wherein said control means starts the test mode by a predetermined signal cycle to activate said data scrambling means, and releases the test mode by another signal cycle to make said data scrambling means inactive.

5. The semiconductor memory device according to claim 4, wherein said control means includes a signal generation circuit for generating a test control signal for controlling the test mode, said test control signal controlling transmission of the scramble condition from said signal latch means to said data scrambling means.

6. The semiconductor memory device according to claim 1, further comprising monitor means for outputting the scramble condition of the data.

7. The semiconductor memory device according to claim 3, further comprising detection means for detecting an error of complementary data of the data of said plurality of transmission lines transmitted through said data descrambler.

8. The semiconductor memory device according to claim 3, wherein said data scrambling means includes a bidirectional data scrambler having both functions of said data scrambler and said data descrambler.

9. The semiconductor memory device according to claim 3, further comprising:
   an input circuit for inputting data;
   a demultiplexer interposed between said input circuit and said data scrambler and having a signal path for distributing data supplied from said input circuit to said plurality of data transmission lines connected to said data scrambler;
   an output circuit for outputting data; and
   a multiplexer interposed between said output circuit and said data descrambler and having a signal path for collecting data, transmitted from said data descrambler to said plurality of data transmission lines, to said output circuit.

10. The semiconductor memory device according to claim 9, wherein said control means includes a signal generation circuit for generating a test control signal for starting the test mode by a predetermined signal cycle to activate said data scrambling means and releasing the test mode by another signal cycle to make said data scrambling means inactive, said test control signal controlling transmission of the scramble condition from said signal latch means to said data scrambling means and controlling operations of said demultiplexer and said multiplexer.

11. A test circuit of a semiconductor memory device, comprising:
   a plurality of data transmission lines corresponding to each of a plurality of memory cells to be selected, for transmitting data;
   signal latch circuits each for latching a signal for setting a scramble condition of the data;
   a data scrambler for scrambling the data in accordance with the scramble condition and changing the scrambled data to write data to be written to each of said plurality of memory cells through said plurality of data transmission lines wherein data is scrambled such that different data is writable to different ones of said memory cells;
   a data descrambler for descrambling read data, which is read out from each of said plurality of memory cells to said plurality of data transmission lines, in accordance with the scramble condition; and
   a controller for determining a test mode, and transmitting the scramble condition from each of said signal latch circuits to said data scrambler to activate said data scrambler and transmitting the scramble condition from each of said signal latch circuits to said data descrambler to activate said data descrambler, wherein said write data transmitted to one of said plurality of memory cells is independent from write data transmitted to another one of said plurality of memory cells.

12. The test circuit according to claim 11, wherein said signal latch circuits latch row address signals, the number of said signal latch circuits corresponding to bits of said row address signals, and each of said signal latch circuits determining one of inversion and noninversion of one data of said plurality of data transmission lines by one bit of the latched signal.

13. The test circuit according to any one of claims 11 and 12, wherein said controller includes a signal generation circuit for generating a test control signal determined by a first signal cycle and a second signal cycle, said first signal cycle starting the test mode to activate said data scrambler and said data descrambler, and said second signal cycle releasing the test mode to set said data scrambler and said data descrambler in a normal data transfer mode.

14. The test circuit according to claim 13, wherein said test control signal controls transmission of the scramble condition from said signal latch circuits to said data scrambler and to said data descrambler.

15. The test circuit according to claim 13, further comprising a monitor for outputting the scramble condition of the data.

16. The test circuit according to claim 15, wherein said monitor supplies latch signals output from said signal latch circuits to corresponding external address pins.

17. The test circuit according to claim 11, further comprising a detector for detecting an error of complementary data of the data of said plurality of transmission lines transmitted through said data descrambler.

18. The test circuit according to claim 11, further comprising:
   an input circuit for inputting data;
   a demultiplexer interposed between said input circuit and said data scrambler and having a signal path for distributing data supplied from said input circuit to said plurality of data transmission lines connected to said data scrambler;
   an output circuit for outputting data;
   a multiplexer interposed between said output circuit and said data descrambler and having a signal path for collecting data, transmitted from said data descrambler to said plurality of data transmission lines, to said output circuit; and
   a detector for detecting an error of complementary data of the data of said plurality of transmission lines transmitted through said data descrambler.

19. The test circuit according to claim 18, wherein said controller includes a signal generation circuit for generating a test control signal for starting the test mode by a predetermined signal cycle to activate said data scrambler and releasing the test mode by another signal cycle to make said data scrambler inactive, said test control signal controlling transmission of the scramble condition from said signal latch circuits to said data scrambler and controlling operations of said demultiplexer and said multiplexer.

20. The test circuit according to claim 18, wherein said detection means includes an error detection circuit for determining whether complementary data of the data transmitted to said plurality of data transmission lines through said data descrambler coincide with one another, and a switching circuit controlled by the test control signal, said switching circuit supplying an output to said output circuit in the test mode.

21. A data scramble circuit of a semiconductor memory device, comprising:

a transmission path comprising a plurality of data transmission lines for transmitting data corresponding to data on said data transmission lines to each of a plurality of memory cells to be select;

signal latch circuits each for latching a signal for setting a scramble condition of the data;

data scrambling means provided on said transmission path, for scrambling the data in accordance with the scramble condition in a test mode and changing the data being transmitted through said transmission path; and control means for determining the test mode, and transmitting the scramble condition from said signal latch circuits to said data scrambling means to operate said data scrambling means, wherein said data transmitted to one of said plurality of memory cells is independent from data transmitted to another one of said plurality of memory cells.

22. The data scramble circuit according to claim 21, wherein said signal latch circuits latch row address signals, the number of said signal latch circuits corresponding to bits of said row address signals, each of said signal latch circuits determining one of inversion and noninversion of one data of said transmission path by one bit of the latched signal, and said signal latch circuits determine the scramble condition.

23. The data scramble circuit according to any one of claims 21 and 22, wherein said data scrambling means includes a data scrambler for scrambling the data in accordance with the scramble condition in the test mode and changing the scrambled data to write data to be written, in parallel, to each of said plurality of memory cells, and a data descrambler for descrambling read data, which is read out in parallel from said each of said plurality of memory cells to said transmission path, in accordance with the scramble condition in the test mode.

24. The data scramble circuit according to any one of claims 21 and 22, wherein said control means includes a signal generation circuit for generating a test control signal for starting the test mode by a predetermined signal cycle to activate said data scrambling means and releasing the test mode by another signal cycle to make said data scrambling means inactive, said test control signal controlling transmission of the scramble condition from said signal latch circuits to said data scrambling means.

25. The data scramble circuit according to claim 24, wherein said data scrambling means is normally set in a data transfer mode, said data transfer mode being a mode other than the test mode.

26. The data scramble circuit according to claim 21, further comprising monitor means for outputting the scramble condition of the data.

27. The data scramble circuit according to claim 26, wherein said monitor means supplies latch signals output from said signal latch circuits to corresponding external address pins.

28. The data scramble circuit according to claim 23, wherein said data scrambling means includes a bidirectional data scrambler having functions of said data scrambler and said data descrambler.

29. The data scramble circuit according to claim 23, further comprising:

an input circuit for inputting data;

a demultiplexer interposed between said input circuit and said data scrambler and having a signal path for distributing data supplied from said input circuit to said transmission path connected to said data scrambler;

an output circuit for outputting data; and a multiplexer interposed between said output circuit and said data descrambler and having a signal path for collecting data, transmitted from said data descrambler to said transmission path, to said output circuit.

30. The data scramble circuit according to claim 29, wherein said control means includes a signal generation circuit for generating a test control signal for starting the test mode by a predetermined signal cycle to activate said data scrambling means and releasing the test mode by another signal cycle to make said data scrambling means inactive, said test control signal controlling transmission of the scramble condition from said signal latch circuits to said data scrambling means and controlling operations of said demultiplexer and said multiplexer.

31. The data scramble circuit according to claim 29, further comprising detection means for detecting an error of complementary data of the data transmitted to said transmission path through said data descrambler.

32. The data scramble circuit according to claim 31, wherein said data detection means includes an error detection circuit for determining whether complementary data, of the data transmitted to said transmission path through said data descrambler, coincide with one another, and a switching circuit controlled by the test control signal, said switching circuit supplying an output to said output circuit in the test mode.

33. A data scramble circuit of a semiconductor device, comprising:

a transmission path, including a plurality of data transmission lines for transmitting data corresponding to data on said data transmission lines to each of a plurality of memory cells to be selected;

signal latch circuits, each for latching a signal for setting a scramble condition of the data;

a data scrambler provided on said transmission path, for scrambling the data in accordance with the scramble condition in a test mode and changing the data being transmitted through said transmission path; and a controller for determining the test mode and transmitting the scramble condition from said signal latch circuits to said data scrambler to operate said data scrambler, wherein the data transmitted to one of said plurality of memory cells is independent from data transmitted to another one of said plurality of memory cells.

* * * * *